(12) United States Patent
Trifonov et al.

(10) Patent No.: US 7,375,585 B2
(45) Date of Patent: May 20, 2008

(54) CIRCUIT AND METHOD FOR SWITCHING ACTIVE LOADS OF OPERATIONAL AMPLIFIER INPUT STAGE

(75) Inventors: Dimitar T. Trifonov, Tucson, AZ (US); Joy Y. Zhang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 180 days.

(21) Appl. No.: 11/120,088

(22) Filed: May 2, 2005

(65) Prior Publication Data

US 2006/0244532 A1    Nov. 2, 2006

(51) Int. Cl.
*H03F 3/45*    (2006.01)
(52) U.S. Cl. ...................................... 330/258
(58) Field of Classification Search ............... None
See application file for complete search history.

(56) References Cited

U.S. PATENT DOCUMENTS

| | | | | |
|---|---|---|---|---|
| 3,531,733 | A * | 9/1970 | Haines, Jr. | 330/256 |
| 4,555,673 | A * | 11/1985 | Huijsing et al. | 330/258 |
| 4,742,308 | A * | 5/1988 | Banu | 330/258 |
| 4,766,394 | A * | 8/1988 | Yukawa | 330/253 |
| 4,918,398 | A * | 4/1990 | Huijsing et al. | 330/252 |
| 5,280,199 | A * | 1/1994 | Itakura | 327/63 |
| 5,311,145 | A * | 5/1994 | Huijsing et al. | 330/255 |
| 5,764,101 | A * | 6/1998 | Archer | 330/253 |
| 5,808,513 | A * | 9/1998 | Archer | 330/253 |
| 6,150,883 | A | 11/2000 | Ivanov | 330/253 |
| 6,281,753 | B1 * | 8/2001 | Corsi et al. | 330/261 |
| 6,486,737 | B1 * | 11/2002 | Carter | 330/257 |
| 6,509,795 | B1 * | 1/2003 | Ivanov | 330/253 |
| 6,559,687 | B1 * | 5/2003 | Hunt | 327/65 |
| 6,573,760 | B1 * | 6/2003 | Gabara | 327/65 |
| 6,617,921 | B2 * | 9/2003 | Forejt | 330/253 |
| 6,630,847 | B2 * | 10/2003 | Hunt | 327/65 |
| 6,756,847 | B2 * | 6/2004 | Blecker et al. | 330/253 |
| 6,937,100 | B2 * | 8/2005 | Anderson | 330/259 |
| 7,064,610 | B2 * | 6/2006 | Wang et al. | 330/253 |
| 7,142,056 | B2 * | 11/2006 | Blecker et al. | 330/253 |
| 2005/0195032 | A1 * | 9/2005 | Wang et al. | 330/253 |
| 2006/0226908 | A1 * | 10/2006 | Abe | 330/257 |

* cited by examiner

*Primary Examiner*—Benny Lee
*Assistant Examiner*—Krista M Flanagan
(74) *Attorney, Agent, or Firm*—Wade J. Brady, III; Frederick J. Telecky, Jr.

(57) ABSTRACT

An operational amplifier having a wide input common mode voltage range includes first (2) and second (3) differential input transistor pairs coupled to first (14) and second (15) tail current transistors. At least one of the first and second tail current transistor pairs is controlled by a common mode control circuit (4). A gate of the first tail current transistor (14) is coupled to the common mode control circuit (4) to turn the first tail current transistor on and to turn the second tail current transistor off when the common mode input voltage is below a common mode threshold voltage (CMTHR). A folded cascode stage (5) is driven by the first and second differential input transistor pairs. Switched active load transistors are coupled to active load transistors of the folded cascode stage and are operable in response to the common mode control circuit to divert part of a current produced by one of the first and second differential input pairs from the folded cascode circuit, depending on whether the common mode input voltage is above or below the common mode threshold voltage.

20 Claims, 3 Drawing Sheets

CIRCUIT AND METHOD FOR SWITCHING ACTIVE LOADS OF OPERATIONAL AMPLIFIER INPUT STAGE

BACKGROUND OF THE INVENTION

The present invention relates generally to operational amplifiers having wide input common mode voltage range, and particularly to such operational amplifiers that include two differential input transistor pairs with "redirection" or "diverting" of tail currents from one input transistor pair to the other as the common mode voltage range changes, and more particularly to improvements which optimize current density in folded cascode circuit active load transistors so as to provide improved noise performance, improved power consumption, improved slew rate, improved overdrive recovery, and low-voltage rail-to-rail circuit operation.

Operational amplifiers having wide input common mode voltage range frequently use two differential input transistor pairs of opposite conductivity type. For example, in one such operational amplifier one input transistor pair includes P-channel MOS input transistors or PNP input transistors and the other input transistor pair includes N-channel MOS input transistors or NPN input transistors. The operational amplifier includes a circuit that monitors the common mode input voltage and operates to "redirect" tail current from the power supply to one input transistor pair or the other, depending on the value of the common mode input voltage.

FIG. 1 shows such a prior art CMOS rail-to-rail operational amplifier in which the drain currents of the two input transistor pairs are coupled to active load transistors which are part of a folded cascode circuit. Operational amplifier 1A includes a "low common mode" voltage input stage 2 including source-coupled P-channel input transistors 10 and 11 and a P-channel tail current transistor 14, wherein P-channel transistor pair 10,11 is operative or "active" only when the common mode (input) voltage is lower than a predetermined common mode threshold voltage CMTHR. Tail current transistor 14 is the output transistor of a controlled current mirror also including diode-connected P-channel transistor 17. Operational amplifier 1A also includes a "high common mode voltage" input stage 3 including source-coupled N-channel input transistors 12 and 13 and an N-channel tail current transistor 15 which is the output transistor of a controlled current mirror including diode-connected N-channel transistor 44, wherein N-channel transistor pair 12,13 is operative or "active" only when the common mode voltage is greater than the predetermined common mode threshold voltage CMTHR. Input signal $V_{IN}+$ is connected by conductor 7 to the gates of transistors 11 and 12, and input signal $V_{IN}-$ is connected by conductor 8 to the gates of input transistors 10 and 13.

The drains of input transistors 10 and 11 are connected by conductors 35 and 36 to drains of N-channel active load transistors 25 and 24, respectively, which are part of folded cascode circuit or stage 5. The gates of active load transistors 24 and 25 are connected to diode-connected N-channel transistor 30, which is biased by a current source 31. The drains of N-channel input transistors 12 and 13 are connected by conductors 37 and 38 to the drains of P-channel active load transistors 20 and 21, respectively, of folded cascode circuit 5. The gates of active load transistors 20 and 21 are connected by conductor 34 to the output of a common mode feedback circuit 6, the inputs of which are connected to output conductors 32 and 33 on which output signals $V_{OUT}-$ and $V_{OUT}+$, respectively, are produced. Output conductor 32 is coupled through P-channel cascode transistor 22 to conductor 37 and through N-channel cascode transistor 26 to conductor 36. Similarly, output conductor 33 is coupled through P-channel cascode transistor 23 to conductor 38 and through N-channel cascode transistor 27 to conductor 35.

Operational amplifier 1A further includes a common mode switch circuit 4 including P-channel transistors 40, 41, and 42, the sources of which are connected to a tail current source 28. The gate of transistor 40 is connected to $V_{IN}+$, the gate of transistor 41 is connected to $V_{IN}-$, and the gate of transistor 42 is connected to the common mode threshold reference voltage CMTHR. The drains of transistors 40 and 41 are connected by conductor 46 to the gate and drain of N-channel diode-connected transistor 43 and to the gate of a N-channel transistor 16 which controls a current mirror including transistor 17 and tail current transistor 14. The drain of transistor 42 is connected by conductor 47 to the gate and drain of diode-connected N-channel transistor 44 and to the gate of tail current transistor 15. Common mode switch circuit 4 detects whether the common mode input voltage of the differential input signal ($V_{IN}+-V_{IN}-$) is above or below the common mode threshold reference voltage CMTHR, and accordingly switches one of tail current transistors 14 and 15 on and switches the other tail current transistor off.

Specifically, if either of $V_{IN}+$ or $V_{IN}-$ is less than the common mode threshold voltage CMTHR, i.e., if the common mode input voltage is "low", then transistors 42, 44, and 15 are off and transistors 43, 16, 17, and 14 are on. Therefore, only the P-channel low common mode voltage input stage 2 is active. However, if both $V_{IN}+$ and $V_{IN}-$ are greater than the common mode threshold voltage CMTHR, i.e., if the common mode input voltage is "high", then transistors 42, 44, and 15 are on and transistors 43, 16, 17 and 14 are off. Therefore, only the N-channel high common mode threshold voltage input stage 3 is active.

A goal in designing an operational amplifier such as prior art operational amplifier 1A is to minimize the current through the folded cascode circuit in order to achieve the best input referred noise, low power consumption, small active load devices in the folded cascode circuit, fast slew rate, and fast overdrive recovery time, and also to achieve good low-voltage rail-to-rail operation. Note that in designing a circuit such as folded cascode circuit 5, the bias voltages $V_{BIASP}$ and $V_{BIASN}$ would be selected so as to ensure the drain-source voltages of the active load transistors 20, 21, 24 and 25 would be at least approximately 100 millivolts beyond the drain-source voltages of those transistors enters into their "triode" or "linear" regions. This would be necessary because the circuitry starts losing gain as soon as the cascode transistors 22, 23, 26 and 27 enter their "triode" or "linear" regions, and that results in loss of range of $V_{OUT}$. Therefore, if the current through the active load transistors 20, 21, 24 and 25 varies by a factor of 2 or 3, then it is necessary to make the load transistors larger to achieve good low voltage operation.

The redirection or switching of tail current from one input transistor pair (e.g., transistors 10 and 11) to the other input transistor pair (transistors 12 and 13) changes the currents in the P-channel active load transistors 20 and 21 and the N-channel active load transistors 24 and 25 in folded cascode circuit 5. To ensure functional operation of folded cascode circuit 5 to ensure proper slew rates in both the low common mode input voltage and high common mode input voltage conditions and to ensure fast overdrive recovery, the current in the active load transistors 20, 21, 24 and 25 must be larger than the input pair tail currents.

To understand this point, it should be noted that the tail current of the "active" input transistor pair 10,11 or 12,13 when it is switched on (in accordance with whether the present common mode voltage is less than or greater than the common mode threshold CMTHR) is added to the "idle" current in the corresponding active load transistors 24,25 or 20, 21, respectively. Also, the tail current of the "inactive" input transistor pair 10,11 or 12,13 when it is switched off (in accordance with whether the present common mode voltage is less than or greater than the common mode threshold CMTHR) is subtracted from the "idle" current in the corresponding active load transistors 24,25 or 20, 21, respectively.

This means that the active load transistors 20, 21, 24, and 25 in folded cascode circuit 5 must be physically large enough to conduct the sum of the "idle" current and the currents through the transistors of the active input pair. The idle current flowing through them must be large enough to ensure that an adequate operating current flows through the active load devices when their corresponding input transistor pairs are either "active" or "inactive".

For example, suppose the N-channel input stage 12,13 is switched to an active condition in response to a high common mode voltage and the current through transistor 15 is 20 microamperes, and the active load transistors 20, 21, 24 and 25 each are designed to conduct 10 microamperes. Then N-channel active load transistors 24 and 25 each will be conducting 10 microamperes, and P-channel active load transistors 20 and 21 will be conducting 20 microamperes. Then, if the common mode voltage goes to a "low" value, N-channel tail current transistor 15 is switched off and the N-channel input transistor pair 12,13 becomes inactive, i.e., turned off. At the same time, P-channel tail current transistor 14 is switched on and conducts 20 microamperes, so P-channel input transistors 10 and 11 each conduct 10 microamperes. However, since the N-channel active load transistors 24 and 25 are designed to sink only 10 microamperes, no current is available to flow through the cascode transistors 22, 23, 26, 27 to P-channel active load transistors 20 and 21. This causes folded cascode circuit 5 to become inoperative.

The foregoing example shows what would happen if the active load transistors 20, 21, 24, and 25 are not physically large enough and are not biased with sufficiently large "idle" currents. To avoid the above described inoperability of folded cascode circuit 5, active load transistors 20, 21, 24 and 25 would normally be designed to be large enough to safely conduct at least 20 microamperes so that there would always be adequate operating current in the active load transistors when their corresponding input pairs are in either their "active" or "inactive" configurations. However, the above described large size of the active load transistors and large "idle" or bias current flowing through them results in a large "redundant" current flowing through folded cascode circuit 5, which is undesirable because that causes increased circuit noise and increased power consumption. Use of large ratio current changes in the active load transistors necessitates use of large active load transistors, but this is undesirable because they have large transconductance (gm), which results in large input-referred noise.

In general, it is difficult optimize the design of a rail-to-rail folded cascode stage for switched input transistor pairs, especially for low voltage, low noise, low-power operation.

Another approach to solving the foregoing problems includes use of a so called "floating current source", wherein an auxiliary amplifier monitors and adjusts the currents in the folded cascode circuit, as described in commonly owned patent U.S. Pat. No. 6,150,883 entitled "RAIL-TO-RAIL INPUT/OUTPUT OPERATIONAL AMPLIFIER AND METHOD" issued to Vadim V. Ivanov on Nov. 21, 2000. However, this approach presents difficulties in a fully differential operational amplifier if there is a need to include gain boost circuitry. The described floating current sources tend to "tie up" one circuit node associated with the cascode transistors so as to not allow use of gain boost circuitry at that point without considerable additional circuit complexity.

Thus, there is an unmet need for an operational amplifier having a wide common mode voltage input range and also having minimum noise.

There also is an unmet need for an operational amplifier having a wide common mode voltage input range and also having low power consumption.

There also is an unmet need for an operational amplifier having a wide common mode voltage input range which operates with optimal current densities in the active load transistors in a folded cascode circuit.

There also is an unmet need for an operational amplifier having a wide common mode voltage input range which operates with optimal current densities in the active load transistors in a folded cascode circuit to provide a high slew rate.

There also is an unmet need for an operational amplifier having a wide common mode voltage input range which operates with optimal current densities in the active load transistors in a folded cascode circuit to provide fast recovery from overdrive conditions.

There also is an unmet need for an operational amplifier having a wide common mode voltage input range which operates with optimal current densities in the active load transistors in a folded cascode circuit so as to provide good rail-to-rail operation at low supply voltages.

There also is an unmet need for a way to provide a fully differential operational amplifier having a wide common mode voltage input range while using gain boost circuitry on both sides of the folded cascode circuitry and nevertheless avoiding complexities associated with use of floating current sources of the kind described in commonly owned patent U.S. Pat. No. 6,150,883 for use in a fully differential operational amplifier.

SUMMARY OF THE INVENTION

It is an object of the invention to provide an operational amplifier having a wide common mode voltage input range and also having minimum noise.

It is another object of the invention to provide an operational amplifier having a wide common mode voltage input range and also having low power consumption.

It is another object of the invention to provide an operational amplifier having a wide common mode voltage input range which operates with optimal current densities in the active load transistors in a folded cascode circuit.

It is another object of the invention to provide an operational amplifier having a wide common mode voltage input range which operates with optimal current densities in the active load transistors in a folded cascode circuit to provide a high slew rate.

It is another object of the invention to provide an operational amplifier having a wide common mode voltage input range which operates with optimal current densities in the active load transistors in a folded cascode circuit to provide fast recovery from overdrive conditions.

It is another object of the invention to provide an operational amplifier having a wide common mode voltage input range which operates with optimal current densities in the active load transistors in a folded cascode circuit so as to provide good rail-to-rail operation at low supply voltages.

It is another object of the invention to provide a fully differential operational amplifier having a wide common mode voltage input range while using gain boost circuitry on both sides of the folded cascode circuitry and nevertheless avoiding complexities associated with use of floating current sources of the kind described in commonly owned patent U.S. Pat. No. 6,150,883 in a fully differential operational amplifier.

Briefly described, and in accordance with one embodiment, the present invention provides an amplifier having a wide input common mode voltage range, including first (2) and second (3) differential input transistor pairs, the first differential input transistor pair (2) being coupled to a first tail current source (14), the second differential input transistor pair (3) being coupled to a second tail current source (15), current flow through one of the first (14) and second (15) tail current sources being controlled by a common mode control circuit (4) in response to a common mode inputcomponent of an input signal applied to the amplifier, the input signal also including a differential component. An output stage (5) has first (37,38) and second (35,36) inputs driven by the second (3) and first (2) differential input transistor pairs, respectively, and produces an output signal representative of the input signal. A first controlled active load circuit (50 or 55) is coupled to one of the first (37,38) and second (35,36) inputs of the output stage (5) and is operable in response to the common mode component of the input signal to divert part of a current produced by the one of the first (2) and second (3) differential input pairs away from the one of the first (37,38) and second (35,36) inputs of the output stage (5).

In a described embodiment, the first tail current source includes a first tail current transistor (14) and the second tail current source includes a second tail current transistor (15), a control electrode of at least one of the first (14) and second (15) tail current transistors being coupled to the common mode control circuit (4). The current flow through the one of the first (14) and second (15) tail current sources can be controlled directly by the common mode control circuit (4) by means of a connection between the common mode control circuit (4) and a control terminal of the one of the first (14) and second (15) tail current sources. The first differential input transistor pair (2) includes first (10) and second (11) input transistors and the second differential input transistor pair (3) includes third (12) and fourth (13) input transistors, a control electrode of the first tail current transistor (14) being coupled to the common mode control circuit (4) to turn the first tail current transistor (14) on and to turn the second tail current transistor (15) off when the common mode component of the input signal is a common mode voltage and is below a common mode threshold voltage (CMTHR). A control electrode of the second tail current transistor (15) is coupled to the common mode control circuit (4) to turn the second tail current transistor (15) on and to turn the first tail current transistor (14) off when the common mode input voltage is above the common mode voltage (CMTHR).

In a described embodiment, the first (10) and second (11) input transistors and the first tail current transistor (14) are P-channel transistors, the third (12) and fourth (13) input transistors and the second tail current transistor (15) are N-channel transistors, and sources of the first (10) and second (11) input transistors are coupled to a drain of the first tail current transistor (14), and sources of the third (12) and fourth (13) input transistors are coupled to a drain of the second tail current transistor (15). The output stage includes a folded cascode circuit (5) including N-channel first (24) and second (25) active load transistors each having a source coupled to a first supply voltage (VSS) and a gate coupled to a first bias source (30,31), the first active load transistor (24) having a drain coupled to a drain of the second input transistor (11), the second active load transistor (25) having a drain coupled to a drain of the first input transistor (10). The first controlled active load circuit includes a first active load circuit (50) including N-channel first (51) and second (52) switched active load transistors each having a source coupled to the first supply voltage (VSS) and a gate coupled to the common mode control circuit (4), drains of the first (51) and second (52) switched active load transistors being coupled to the drains of the first (10) and second (11) input transistors, respectively. The folded cascode circuit (5) includes P-channel third (20) and fourth (21) active load transistors each having a source coupled to a second supply voltage (VDD) and a gate coupled to a common mode feedback circuit (6), the third active load transistor (20) having a drain coupled to a drain of the third input transistor (12), the second active load transistor (21) having a drain coupled to a drain of the fourth input transistor (13). The amplifier including a second controlled active load circuit (55) including P-channel third (56) and fourth (57) switched active load transistors each having a source coupled to the second supply voltage (VDD) and a gate coupled to the common mode control circuit (4), drains of the third (56) and fourth (57) switched active load transistors being coupled to the drains of the third (12) and fourth (13) input transistors, respectively.

The folded cascode circuit (5) includes P-channel first (22) and second (23) cascode transistors and N-channel third (26) and fourth (27) cascode transistors, sources of the first (22) and second (23) cascode transistors being coupled to drains of the third (20) and fourth (21) active load transistors, respectively, sources of the third (26) and fourth (27) cascode transistors being coupled to drains of the first (24) and second (25) active load transistors, respectively, drains of the first (22) and third (26) cascode transistors being coupled to a first output conductor (32), drains of the second (23) and fourth (27) cascode transistors being coupled to a second output conductor (33). An input of the common mode control circuit (4) is directly coupled to receive the input signal. In one embodiment, an input of the common mode control circuit (4) is coupled to sources of the first (10) and second (11) input transistors.

In a described embodiment, a current direction reversal circuit (59,58) having an input coupled to the common mode control circuit (4) and an output coupled to gate of the third (56) and fourth (57) switched active load transistors, wherein the common mode control circuit (4) is operative to turn on the first (51) and second (52) switched active load transistors and to turn off the third (56) and fourth (57) switched active load transistors when the common mode voltage is below the common mode threshold voltage (CMTHR). The common mode control circuit (4) is operative to turn on the third (56) and fourth (57) switched active load transistors and to turn off the first (51) and second (52) switched active load transistors when the common mode voltage is above the common mode threshold voltage (CMTHR).

DETAILED DESCRIPTION OF THE PREFERRED EMBODIMENTS

Figure 1:
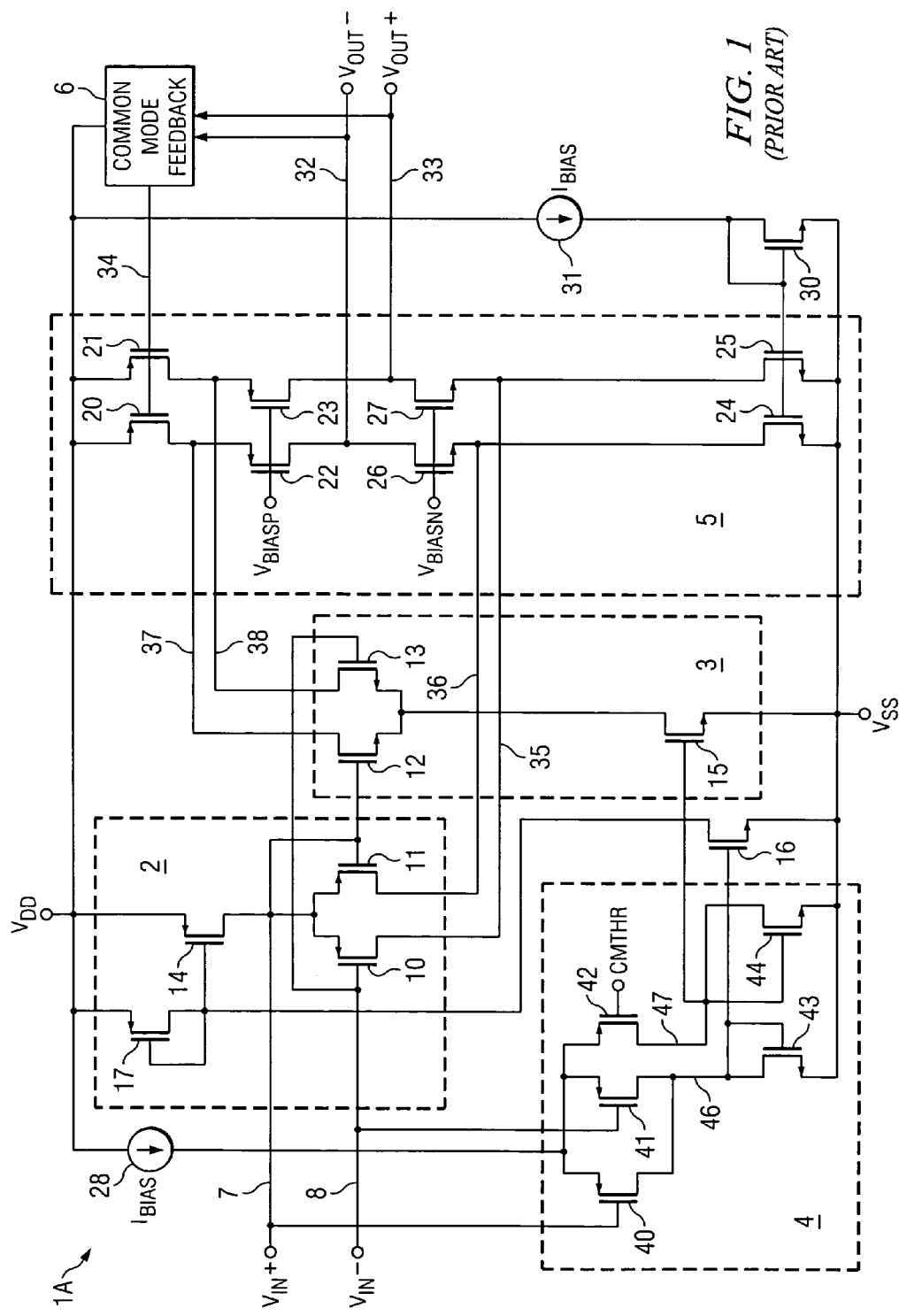
FIG. 1 is schematic diagram of a prior art operational amplifier having a wide input common mode voltage range.
Figure 2:
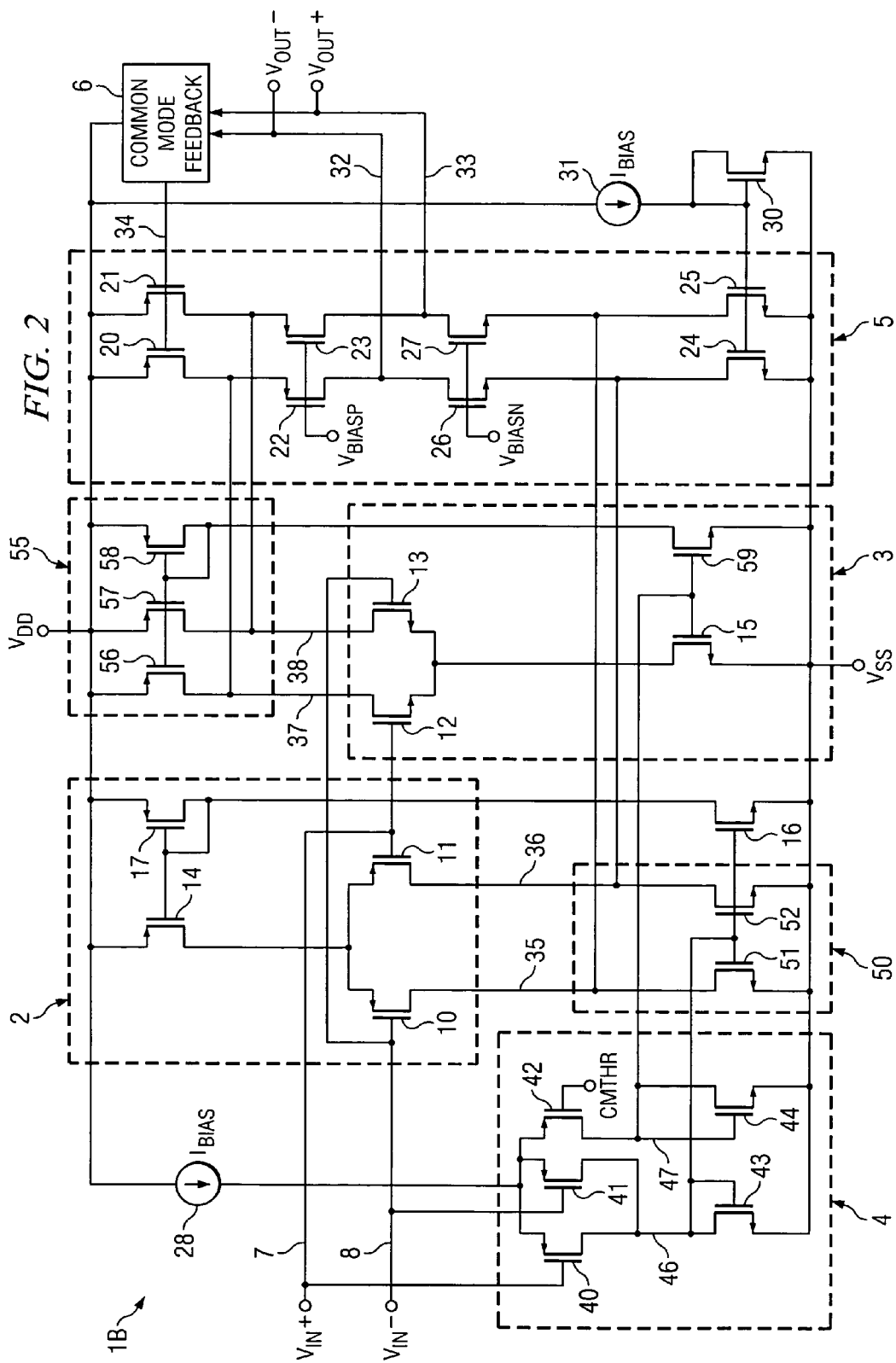
FIG. 2 is a schematic diagram of an operational amplifier according to the present invention.

Referring to FIG. 2, operational amplifier 1B includes a low common mode voltage input stage 2 as in prior art FIG. 1, including source-coupled P-channel input transistors 10 and 11 and P-channel tail current transistor 14 connected to the sources of input transistors 10 and 11. The source of tail current transistor 14 is connected to VDD, and its gate is connected to the gate and drain of diode-connected P-channel transistor 17, the source of which is connected to VDD. Tail current transistor 14 is the output transistor of a controlled current mirror also including transistor 17. Operational amplifier 1B also includes high common mode voltage input stage 3 including source-coupled N-channel input transistors 12 and 13 and N-channel tail current transistor 15, which is one of the output transistors of a controlled current mirror including diode-connected N-channel transistor 44. The source of tail current transistor 15 is connected to VSS, and its gate is connected to the gate and drain of diode-connected N-channel transistor 44. Input signal $V_{IN}+$ is coupled by conductor 7 to the gates of input transistors 11 and 12, and input signal $V_{IN}-$ is coupled by conductor 8 to the gates of input transistors 10 and 13.

As in prior art FIG. 1, the drains of input transistors 10 and 11 in FIG. 2 are connected by conductors 35 and 36 to the drains of N-channel active load transistors 25 and 24, respectively, which are part of folded cascode circuit 5. The sources of active load transistors 24 and 25 are connected to VSS, and their gates are connected to the gate and drain of diode-connected N-channel transistor 30, the source of which is connected to VSS. The gate and drain of transistor 30 are connected to a bias current source 31, which sets the "idle" current through N-channel active load transistors 24 and 25. The drains of N-channel input transistors 12 and 13 are connected by conductors 37 and 38 to the drains of P-channel active load transistors 20 and 21, respectively, of folded cascode circuit 5. The sources of active load transistors 20 and 21 are connected to VDD. The gates of active load transistors 20 and 21 are connected by conductor 34 to the output of a conventional common mode feedback circuit 6, the inputs of which are connected to output conductors 32 and 33 which conduct output signals $V_{OUT}-$ and $V_{OUT}+$, respectively. Output conductor 32 is coupled through P-channel cascode transistor 22 to conductor 37 and through N-channel cascode transistor 26 to conductor 36. Similarly, output conductor 33 is coupled through P-channel cascode transistor 23 to conductor 38 and through N-channel cascode transistor 27 to conductor 35. The gates of P-channel cascode transistors 22 and 23 are connected to a bias voltage $V_{BIASP}$, and the gates of N-channel cascode transistors 26 and 27 are connected to a bias voltage $V_{BIASN}$.

Operational amplifier 1B includes common mode switch circuit 4 which is the same as in prior art FIG. 1, and which includes P-channel transistors 40, 41, and 42, the sources of which are connected to tail current source 28. The gate of transistor 40 is connected to $V_{IN}+$, the gate of transistor 41 is connected to $V_{IN}-$, and the gate of transistor 42 is connected to a common mode threshold reference voltage CMTHR. The drains of transistors 40 and 41 are connected by conductor 46 to the gate and drain of N-channel diode-connected transistor 43 and to the gate of N-channel transistor 16, which controls the current mirror including diode-connected transistor 17 and tail current source transistor 14. The drain of transistor 42 is connected by conductor 47 to the gate and drain of diode-connected N-channel transistor 44 and to the gate of tail current transistor 15 of high common mode voltage input stage 3. The sources of transistors 43 and 44 are connected to VSS.

In accordance with the present invention, operational amplifier 1B includes switching load circuitry 50, including N-channel switched active load transistors 51 and 52, the sources of which are connected to VSS. The drains of switched active load transistors 51 and 52 are connected to the drains of input transistors 10 and 11 by conductors 35 and 36, respectively. The gates of switched active load transistors 51 and 52 are connected to conductor 46. The source of N-channel transistor 16 is connected to VSS, its gate is connected by conductor 46 to the gate and drain of diode-connected transistor 43, and its drain is connected to the gate and drain of diode-connected transistor 17 (as in prior art FIG. 1).

Also in accordance with the present invention, switching load device circuit 55 includes P-channel switching load transistors 56 and 57, the drains of which are connected by conductors 37 and 38 to the drains of -channel input transistors 13 and 12, respectively. The sources of switching load transistors 56 and 57 are connected to VDD, and their gates are connected to the gate and drain of a P-channel diode-connected transistor 58, the source of which is connected to VDD. The gate and drain of diode-connected transistor 58 are also connected to the drain of an N-channel transistor 59, the source of which is connected to VSS and the gate of which is connected by conductor 47 to the gate and drain of diode-connected transistor 44 of common mode switch circuit 4. N-channel transistor 59 mirrors the current in diode-connected transistor 44 up to diode-connected P-channel 58 to control P-channel load transistors 56 and 57.

Common mode switch circuit 4 detects whether the common mode input voltage is above or below common mode threshold reference voltage CMTHR, and accordingly switches one of tail current transistors 14 or 15 on and switches the other one off, and also controls the switched active load transistors 51, 52, 56 and 57.

The operational amplifier 1B of FIG. 2 solves the earlier described problems of the prior art circuit of FIG. 1 by switching the switched active load transistors 51, 52, 56 and 57 on and off simultaneously with the "redirection" or "diverting" of power supply current from one to the other of the input pair tail current sources when the common mode voltage moves from above CMTHR to below it, or vice versa. This is done gradually over the switching range of the common mode switch circuit 4 so the P-channel active load transistors 20 and 21 of the upper portion of folded cascode circuit 5 and the N-channel active load transistors 24 and 25 in the lower portion of folded cascode circuit 5 always operate with constant, relatively low current and optimal current density in such a way that the currents in the folded cascode circuit are relatively constant and are of relatively low value. It should be noted that the current in the switching loads tracks the input pair tail current of the corresponding input pair, so it doesn't matter if the common mode switch circuit 4 turns the tail current transistors 14 and 15 on and off abruptly or gradually. Even for gradual switching, the currents flowing into the inputs 35, 36 and 37, 38 of the folded cascode circuit still maintain essentially the same values as for fast switching. The optimal current density referred to is a value which allows minimum transconductance (gm) of the active load transistors so as to minimize input-referred noise.

As an alternative, it should be noted that it would be possible to use non-switching tail current sources and instead provide switching circuitry turn off the corresponding differential input transistor pair in response to the common mode switch circuit 4, rather than directly switching off its tail current source. In any case, the flow of current through the tail current sources is either directly or indirectly controlled in response to the common mode switch circuit 4.

Switched active load transistors 51 and 52 are switched on when P-channel input transistor pair 10,11 is active and are switched off when N-channel input transistor pair 12,13 is active. Conversely, switched active load transistors 56 and 57 are switched on when N-channel input transistor pair 12,13 is active and switched off when the P-channel input transistor pair is active. The currents in the folded cascode transistor through active load transistors 22, 23, 26, and 27 therefore are always essentially constant.

For example, if N-channel tail current transistor 15 is designed to conduct 20 microamperes when the common mode voltage is greater than the common mode threshold voltage CMTHR, then N-channel input transistors 12 and 13 each conduct 10 microamperes, and P-channel switched active load transistors 56 and 57 are turned on. If the "idle" or bias current in each of active load transistors 24 and 25, as determined by current source 31, is equal to 5 microamperes, then P-channel active load transistors 20 and 21 also each conduct 5 microamperes. Therefore, P-channel switched active load transistors 56 and 57 each supply a 10 microampere current to N-channel input transistors 12 and 13, respectively. Therefore, there is no way that P-channel active load transistors 20 and 21 can be deprived of operating current so as to make folded cascode stage 5 inoperative.

If the common mode voltage goes below the common mode threshold voltage CMTHR, then N-channel current source transistor 15 and P-channel switched active load transistors 56 and 57 are turned off, and P-channel tail current source transistor 14 and N-channel switched active load transistors 51 and 52 are turned on. Tail current transistor 14 supplies 20 microamperes, which is divided into 10 microamperes through P-channel input transistor 10 and 10 microamperes through P-channel input transistor 11. The 5 microampere idle current or bias current continues to flow through active load transistors 24, 25, 20 and 21 in folded cascode circuit 5. N-channel switched active load transistors 51 and 52 each conduct the 10 microampere currents from input transistors 10 and 11, respectively. Thus, the current through P-channel switched active load transistors 20 and 21 and N-channel active load transistors 24 and 25 in folded cascode circuit 5 is constant and equal to 5 microamperes.

The constant current through folded cascode circuit active load devices 20, 21, 24 and 25 and the physical sizes of those load devices can be selected to be values that optimize the noise, power consumption, slew rate, overdrive recovery, and low-voltage rail-to-rail operation of operational amplifier 1B.

To summarize, the configuration of operational amplifier 1B shown in FIG. 2 allows use of very small current in the active load transistors 20, 21, 24 and 25 in folded cascode circuit 5, and thereby allows the current in the active load transistors to be selected so as to optimize the folded cascode for low noise, small transistor sizes, low power consumption, and low voltage rail-to-rail performance of operational amplifier 1B.

Figure 3:
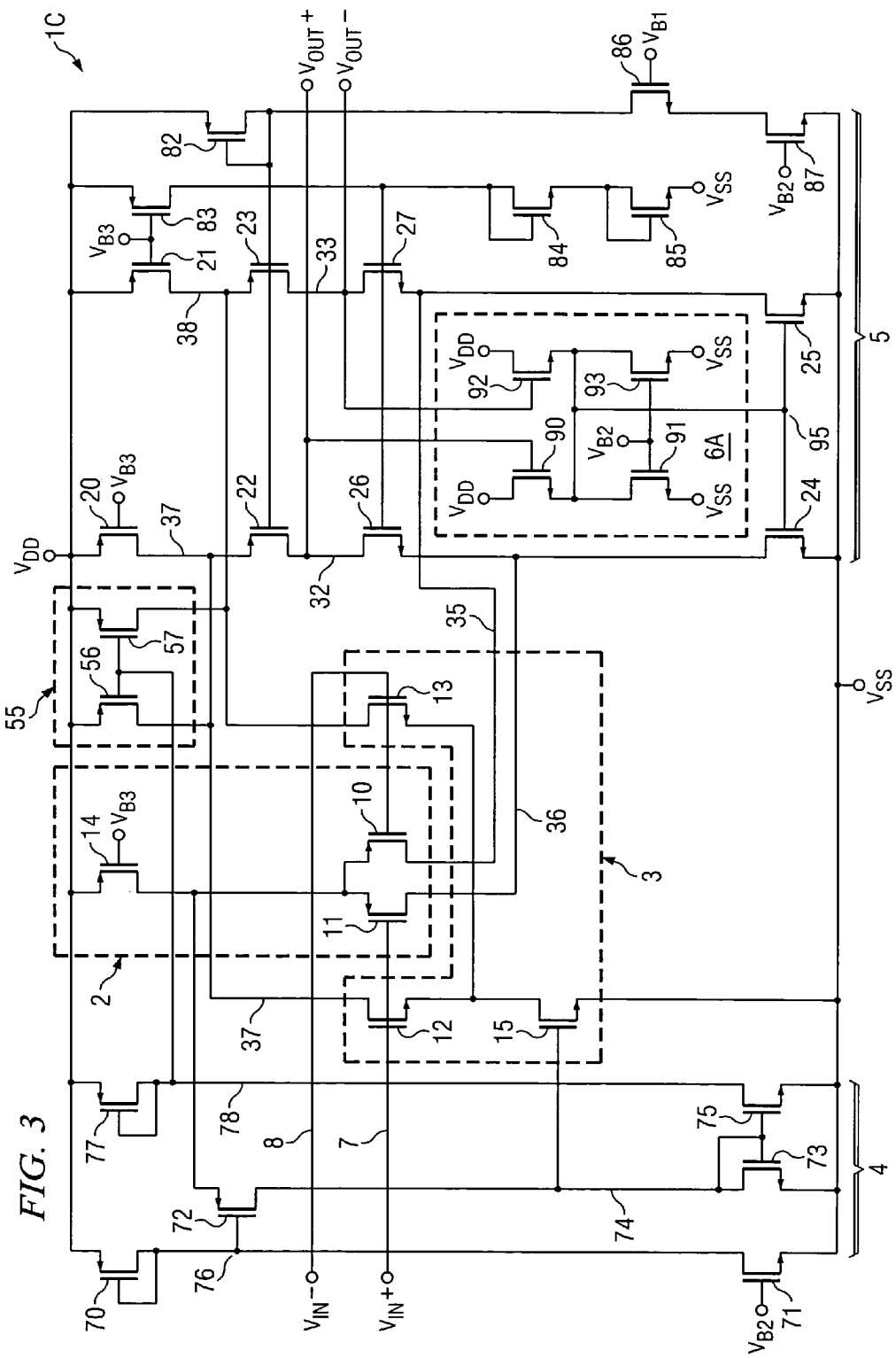
FIG. 3 is a schematic diagram of another operational amplifier according to the present invention.

Another rail-to-rail operational amplifier 1C of the invention is shown in FIG. 3, wherein switched active load transistors are provided for only the N-channel differential input stage 3. This embodiment may be useful to provide reduced quiescent current for the operational amplifier 1C in an application in which the common mode voltage ordinarily is below the threshold voltage established by transistors 70 and 71. In FIG. 3, operational amplifier 1C is generally similar to operational amplifier 1B of FIG. 2, and where appropriate, the same reference numerals are used in FIG. 3 to designate similar or identical elements. In FIG. 3, low common mode voltage input stage 2 includes input transistors 10 and 11 having their sources connected to the drain of current source transistor 14, but the gate of current source transistor 14 is biased by a constant voltage $V_{B3}$, rather than being controlled by common mode switch circuit 4. High common mode voltage input stage 3 includes input transistors 12 and 13 having their sources connected to the drain of current source transistor 15. The gate of current source transistor 15 in FIG. 3 is driven by common mode switch circuit 4 in response to the differential input signal applied to input conductors 7 and 8.

The structure of common mode switch circuit 4 in FIG. 3 is considerably different than in FIG. 2. In FIG. 3, common mode switch circuit 4 includes a P-channel transistor 72 having its source connected to the sources of input transistors 1 0 and 11 and its drain connected by conductor 74 to a current mirror including N-channel transistors 73 and 75, and also to the gate of tail current transistor 15, which is part of the same current mirror. The gate of transistor 72 is connected by conductor 76 to the drain and gate of a diode-connected P-channel transistor 70, the source of which is connected to VDD. Conductor 76 also is connected to the drain of N-channel transistor 71, the source of which is connected to VSS. The gate of transistor 71 is connected to a bias voltage $V_{B2}$. The voltage on conductor 76 is a common mode threshold voltage similar to CMTHR in FIG. 2. Input conductors 7 and 8 are not directly connected to common mode switch circuit 4 in FIG. 3, unlike the embodiment of FIG. 2.

Folded cascode circuit 5 in FIG. 3 is quite similar to the folded cascode circuit in FIG. 2. The gates of active load transistors 20 and 21 are connected to a bias voltage $V_{B3}$. However, in FIG. 3, common mode feedback circuit 6A includes N-channel transistors 90, 91, 92 and 93. The drains of transistors 90 and 92 are connected to VDD, and the sources of transistors 91 and 93 are connected to VSS. The gates of transistors 91 and 93 are connected to a bias voltage $V_{B2}$. The drain of transistor 91 is connected by conductor 95 to the source of transistor 90, the drain of transistor 93, the source of transistor 92, and the gates of active load transistors 24 and 25. The gate of transistor 90 is connected to $V_{OUT}+$, and the gate of transistor 92 is connected to $V_{OUT-}$. Transistors 82, 86, 87 provide the bias for the cascode P-channel transistors 22 and 23 and transistors 83-85 provide the bias for the cascode N-channel transistors 26 and 27.

In FIG. 3, switching load circuitry 55 includes P-channel switched active load transistors 56 and 57, the sources of which are connected to VDD and the drains of which are connected to conductors 37 and 38, respectively. The gates of switched active load transistors 56 and 57 are connected by conductor 78 to the drain and gate of a P-channel transistor 77 having its source connected to VDD. Conductor 78 also is connected to the drain of current mirror output transistor 75 of common mode control circuit 4. However, no switched active load transistors are connected to conductors 35 and 36.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, bipolar transistors rather than CMOS transistors could be used.

What is claimed is:

1. An amplifier having a wide input common mode voltage range, comprising:
   (a) first and second differential input transistor pairs, first electrodes of transistors of the first differential input transistor pair being coupled to a first tail current source, first electrodes of transistors of the second differential input transistor pair being coupled to a second tail current source, current flow through one of the first and second tail current sources being controlled by a common mode control circuit in response to an input signal of a differential input signal applied to the amplifier, the input signal including a differential component and a common mode component;
   (b) an output stage having first and second inputs driven by the second and first differential input transistor pairs, respectively, the output stage producing an output signal representative of the differential component of the input signal; and
   (c) a first controlled active load circuit connected to second electrodes of one of the first and second differential input transistor pairs and coupled to one of the first and second inputs of the output stage and operable in response to the common mode component of the input signal to divert part of a current through the one of the first and second differential input pairs away from the one of the first and second inputs of the output stage.

2. The amplifier of claim 1 wherein the first tail current source includes a first tail current transistor and the second tail current source includes a second tail current transistor, a control electrode of at least one of the first and second tail current transistors being coupled to the common mode control circuit.

3. The amplifier of claim 2 wherein the current flow through the one of the first and second tail current transistors is controlled directly by the common mode control circuit by means of a connection between the common mode control circuit and the control electrode of the one of the first and second tail current transistors.

4. The amplifier of claim 3 wherein the common mode component of the input signal is a common mode voltage.

5. The amplifier of claim 4 wherein the first differential input transistor pair includes first and second input transistors and the second differential input transistor pair includes third and fourth input transistors, the control electrode of the first tail current transistor being coupled to the common mode control circuit to turn the first tail current transistor on and to turn the second tail current transistor off when the common mode voltage is below a common mode threshold voltage.

6. The amplifier of claim 5 wherein the control electrode of the second tail current transistor is coupled to the common mode control circuit to turn the second tail current transistor on and to turn the first tail current transistor off when the common mode voltage is above the common mode threshold voltage.

7. The amplifier of claim 6 wherein the first and second input transistors and the first tail current transistor are P-channel transistors, and wherein the third and fourth input transistors and the second tail current transistor are N-channel transistors, and wherein sources of the first and second input transistors are coupled to a drain of the first tail current transistor, and wherein sources of the third and fourth input transistors are coupled to a drain of the second tail current transistor.

8. The amplifier of claim 7 wherein the output stage includes a folded cascode circuit including N-channel first and second active load transistors each having a source coupled to a first supply voltage and a gate coupled to a first bias source, the first active load transistor having a drain coupled to a drain of the second input transistor, the second active load transistor having a drain coupled to a drain of the first input transistor.

9. The amplifier of claim 8 wherein the first controlled active load circuit includes a first active load circuit including N-channel first and second switched active load transistors each having a source coupled to the first supply voltage and a gate coupled to the common mode control circuit, drains of the first and second switched active load transistors being coupled to the drains of the first and second input transistors, respectively.

10. The amplifier of claim 9 wherein the folded cascode circuit includes a second active load circuit including P-channel third and fourth active load transistors each having a source coupled to a second supply voltage and a gate coupled to a common mode feedback circuit, the third active load transistor having a drain coupled to a drain of the third input transistor, the second active load transistor having a drain coupled to a drain of the fourth input transistor.

11. The amplifier of claim 10 including a second controlled active load circuit that includes a second active load circuit including P-channel third and fourth switched active load transistors each having a source coupled to the second supply voltage and a gate coupled to the common mode control circuit, drains of the third and fourth switched active load transistors being coupled to the drains of the third and fourth input transistors, respectively.

12. The amplifier of claim 10 wherein the folded cascode circuit includes P-channel first and second cascode transistors and N-channel third and fourth cascode transistors, sources of the first and second cascode transistors being coupled to the drains of the third and fourth active load transistors, respectively, sources of the third and fourth cascode transistors being coupled to the drains of the first and second active load transistors, respectively, drains of the first and third cascode transistors being coupled to a first output conductor, drains of the second and fourth cascode transistors being coupled to a second output conductor.

13. The amplifier of claim 5 wherein an input of the common mode control circuit is directly coupled to receive the input signal.

14. The amplifier of claim 5 wherein an input of the common mode control circuit is coupled to sources of the first and second input transistors.

15. The amplifier of claim 11 including a current direction reversal circuit having an input coupled to the common mode control circuit and an output coupled to the gates of the third and fourth switched active load transistors, wherein the common mode control circuit is operative to turn on the first and second switched active load transistors and to turn off the third and fourth switched active load transistors when the common mode voltage is below the common mode threshold voltage, and wherein the common mode control circuit is operative to turn on the third and fourth switched active load transistors and to turn off the first and second switched active load transistors when the common mode voltage is above the common mode threshold voltage.

16. A method of operating an amplifier, comprising:
  (a) providing first and second differential input transistor pairs, first electrodes of transistors of the first differential input transistor pair being coupled to a first tail current transistor, first electrodes of transistors of the second differential input transistor pair being coupled to a second tail current transistor,
  (b) controlling flow of current in at least one of the first and second tail current transistors by means of a common mode control circuit in response to a common mode component of an input signal applied to the amplifier, the input signal including a differential component;
  (c) providing an output stage having first and second inputs driven by the first and second differential input transistor pairs, respectively, the output stage producing an output signal representative of the input signal; and
  (d) operating a first controlled active load circuit connected to second electrodes of one of the first and second differential input transistor pairs and coupled to one of the first and second inputs of the output stage in response to the common mode component of the input signal to divert part of a current through one of the first and second differential input transistor pairs away from one of the first and second inputs of the output stage.

17. The method of claim 16 wherein the output stage is a folded cascode output stage, the method including controlling both of the first and second tail current transistors by means of the common mode circuit, wherein step (d) includes operating a first controlled active load circuit coupled to the first input of the output stage in response to the common mode component of the input signal to divert part of a current through the first differential input transistor pair away from the first input of the folded cascode output stage, and operating a second controlled active load circuit coupled to the second input of the folded cascode output stage in response to the common mode component of the input signal to divert part of a current through the second differential input transistor pair from the second input of the folded cascode output stage.

18. The method of claim 17 wherein step (d) includes diverting a sufficient part of the current through the first differential input transistor pair away from the first input of the folded cascode output stage to ensure flow of a substantially constant current in active load devices of the folded cascode output stage coupled to the first input of the folded cascode output stage and diverting a sufficient part of the current through the second differential input transistor pair away from the second input of the folded cascode output stage to ensure flow of a substantially constant current in active load devices of the folded cascode output stage coupled to the second input of the folded-cascode output stage.

19. The method of claim 18 wherein step (d) includes diverting at least a substantial portion of the current through the first differential transistor pair through a first pair of switched active load transistors of the first controlled active load circuit in response to the common mode control circuit, and wherein step (d) also includes diverting at least a substantial portion of the current through the second differential transistor pair through a second pair of switched active load transistors of the second controlled active load circuit in response to the common mode control circuit.

20. An amplifier including means for providing a wide input common mode voltage range, the amplifier comprising:
  (a) first and second differential input transistor pairs, first electrodes of transistors of the first differential input transistor pair being coupled to a first tail current transistor, first electrodes of transistors of the second differential input transistor pair being coupled to a second tail current transistor,
  (b) means for controlling flow of current through at least one of the first and second tail current transistor pairs by means of a common mode control circuit in response to a common mode component of an input signal applied to the amplifier, the input signal also having a differential component;
  (c) an output stage having first and second inputs driven by the first and second differential input transistor pairs, respectively, for producing an output signal representative of the input signal; and
  (d) controlled active load circuit means connected to second electrodes of one of the first and second differential input transistor pairs and coupled to one of the first and second inputs of the output stage in response to the common mode component of the input signal for diverting part of a current produced by one of the first and second differential input pairs away from the one of the first and second inputs of the output stage.

* * * * *